(12) United States Patent
Minzoni

(10) Patent No.: US 7,199,629 B2
(45) Date of Patent: Apr. 3, 2007

(54) CIRCUIT HAVING DELAY LOCKED LOOP FOR CORRECTING OFF CHIP DRIVER DUTY DISTORTION

(75) Inventor: Alessandro Minzoni, Morrisville, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/974,521

(22) Filed: Oct. 27, 2004

(65) Prior Publication Data

US 2006/0087354 A1    Apr. 27, 2006

(51) Int. Cl.
H03L 7/06 (2006.01)

(52) U.S. Cl. ........................ 327/158; 713/400

(58) Field of Classification Search ............... None
See application file for complete search history.

(56) References Cited

U.S. PATENT DOCUMENTS

| | | | |
|---|---|---|---|
| 6,137,327 A | 10/2000 | Schnell | 327/158 |
| 6,313,674 B1 * | 11/2001 | Akita et al. | 327/155 |
| 6,337,834 B1 | 1/2002 | Isobe et al. | 365/233 |
| 6,396,322 B1 * | 5/2002 | Kim et al. | 327/158 |
| 6,696,872 B1 | 2/2004 | Le et al. | 327/158 |
| 6,704,881 B1 * | 3/2004 | Li et al. | 713/401 |
| 6,934,215 B2 * | 8/2005 | Chung et al. | 365/233 |
| 6,968,026 B1 * | 11/2005 | Li et al. | 375/371 |

* cited by examiner

Primary Examiner—Timothy P. Callahan
Assistant Examiner—An T. Luu
(74) Attorney, Agent, or Firm—Dicke, Billig & Czaja, PLLC (57) ABSTRACT

A circuit comprises an off chip driver and a delay locked loop. The delay locked loop is configured to receive a clock signal and provide a first signal for compensating for a rising edge propagation delay through the off chip driver and a second signal for compensating for a falling edge propagation delay through the off chip driver. The off chip driver is configured to receive the first signal and the second signal and output data aligned with the clock signal.

17 Claims, 6 Drawing Sheets

CIRCUIT HAVING DELAY LOCKED LOOP FOR CORRECTING OFF CHIP DRIVER DUTY DISTORTION

BACKGROUND

Delay locked loops (DLLs) are used to align data output from circuits, such as memory circuits, to the clock signal of a host. A DLL receives a clock signal from a host and provides a DLL signal to an off chip driver (OCD) to align data output from the circuit to the clock signal of the host. The DLL compensates for differences in timing between the circuit and the host. Off chip drivers typically have a rising edge propagation delay through the off chip driver that is different from the falling edge propagation delay through the off chip driver.

Typically, DLLs account for the rising edge propagation delay through the off chip driver, but do not account for the falling edge propagation delay through the off chip driver. For example, while a logic high data signal that generates a rising edge signal through the off chip driver may be aligned with the rising edge of the clock signal of the host, a logic low data signal that generates a falling edge signal through the off chip driver may not be aligned with the falling edge of the clock signal of the host.

SUMMARY

Embodiments of the invention provide a circuit, and in one or more embodiments provide a memory circuit. In one embodiment, the present invention provides a circuit. The circuit comprises an off chip driver and a delay locked loop. The delay locked loop is configured to receive a clock signal and provide a first signal for compensating for a rising edge propagation delay through the off chip driver and a second signal for compensating for a falling edge propagation delay through the off chip driver. The off chip driver is configured to receive the first signal and the second signal and output data aligned with the clock signal.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
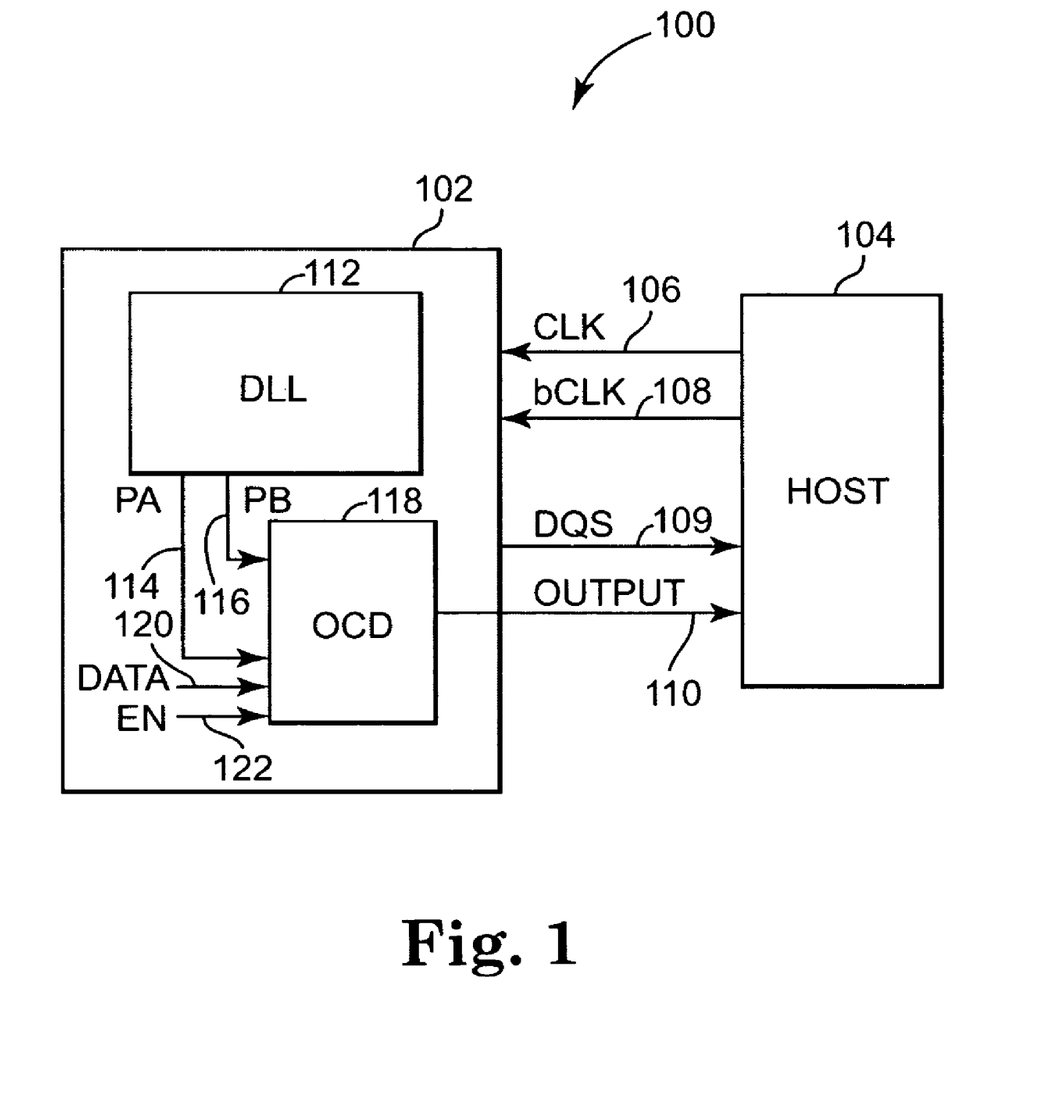
FIG. 1 is a block diagram illustrating one embodiment of a memory circuit coupled to a host.

FIG. 1 is a block diagram illustrating one embodiment of a system 100 comprising a memory circuit 102 coupled to a host 104. Memory circuit 102 includes a delay locked loop for correcting for off chip driver duty distortion. The delay locked loop receives a clock signal and provides a first signal for compensating for a rising edge propagation delay through the off chip driver and a second signal for compensating for a falling edge propagation delay through the off chip driver. The off chip driver receives the first signal and the second signal and outputs data aligned with the clock signal. In one embodiment, memory circuit 102 comprises a random access memory, such as a synchronous dynamic random access memory.

Memory circuit 102 includes delay locked loop (DLL) 112 and off chip driver (OCD) 118. DLL 112 is electrically coupled to OCD 118 through PA signal path 114 and PB signal path 116. OCD 118 receives a data signal on data path 120 and an enable (EN) signal on enable signal path 122. OCD 118 is electrically coupled to host 104 through output signal path 110. Host 104 is electrically coupled to memory circuit 102 through clock (CLK) signal path 106, inverted clock signal (bCLK) signal path 108, and DQS signal path 109.

Host 104 reads data from and writes data to memory circuit 102. The enable signal on enable signal path 122 enables OCD 118 during a read operation and disables OCD 118 during a write operation. In one embodiment, host 104 requests data from memory circuit 102 and enables OCD 118. Host 104 transmits a clock signal on clock signal path 106 and an inverted clock signal on bCLK signal path 108 to memory circuit 102. DLL 112 receives the clock signal and the inverted clock signal and generates the PA signal on PA signal path 114 and the PB signal on PB signal path 116. The PA signal on PA signal path 114 is provided to OCD 118 to output logic high data from data path 120 to output signal path 110 and align the data with the clock signal. The PB signal on PB signal path 116 is provided to OCD 118 to output logic low data from data path 120 to output signal path 110 and align the data with the clock signal.

Figure 2:
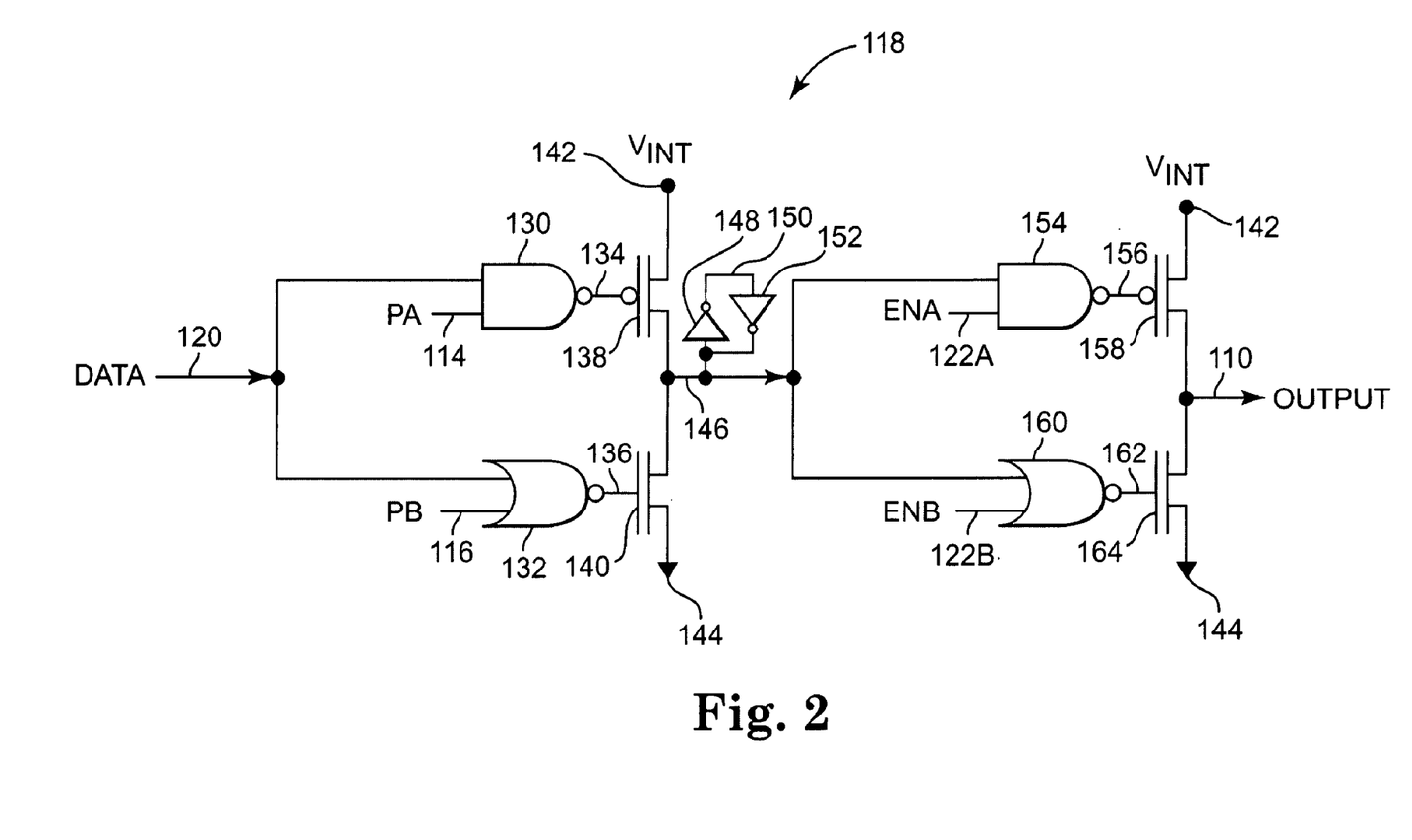
FIG. 2 is a schematic diagram illustrating one embodiment of an off chip driver (OCD).

FIG. 2 is a schematic diagram illustrating one embodiment of OCD 118. OCD 118 includes NAND gates 130 and 154, NOR gates 132 and 160, inverters 148 and 152, P-channel metal-oxide semiconductor field-effect transistors (PMOSFETs) 138 and 158, and N-channel MOSFETs 140 and 164. Data path 120 is electrically coupled to a first input of NAND gate 130 and a first input of NOR gate 132. PA signal path 114 is electrically coupled to a second input of NAND gate 130. The output of NAND gate 130 is electrically coupled to the gate of transistor 138 through signal path 134.

PB signal path 116 is electrically coupled to a second input of NOR gate 132. The output of NOR gate 132 is electrically coupled to the gate of transistor 140 through signal path 136. One side of the source-drain path of transistor 138 is electrically coupled to an internal voltage ($V_{INT}$) 142, and the other side of the source-drain path of transistor 138 is electrically coupled to data path 146. One side of the source-drain path of transistor 140 is electrically coupled to data path 146, and the other side of the source-drain path of transistor 140 is electrically coupled to common or ground 144.

Data path 146 is electrically coupled to the input of inverter 148, the output of inverter 152, a first input of NAND gate 154, and a first input of NOR gate 160. The output of inverter 148 is electrically coupled to the input of inverter 152 through path 150. A second input of NAND gate 154 receives an enable A (ENA) signal on ENA signal path 122A. The output of NAND gate 154 is electrically coupled to the gate of transistor 158 through signal path 156. A second input of NOR gate 160 receives an enable B (ENB) signal on ENB signal path 122B.

The output of NOR gate 160 is electrically coupled to the gate of transistor 164 through signal path 162. One side of the source-drain path of transistor 158 is electrically coupled to $V_{INT}$ 142, and the other side of the source-drain path of transistor 158 is electrically coupled to output signal path 110. One side of the source-drain path of transistor 164 is electrically coupled to output signal path 110, and the other side of the source-drain path of transistor 164 is electrically coupled to common or ground 144.

With a logic high signal on data path 120 and a logic high signal on PA signal path 114, NAND gate 130 outputs a logic low signal on signal path 134. With a logic low signal on signal path 134, transistor 138 turns on and passes the $V_{INT}$ signal from $V_{INT}$ 142 to data path 146. With a logic low signal on data path 120, NAND gate 130 outputs a logic high signal on signal path 134. With a logic high signal on signal path 134, transistor 138 turns off and the source-drain path of transistor 138 is high impedance.

With a logic low signal on data path 120 and a logic low signal on PB signal path 116, NOR gate 132 outputs a logic high signal on signal path 136. With a logic high signal on signal path 136, transistor 140 turns on and passes the common signal from common 144 to data path 146. With a logic high signal on data path 120, NOR gate 132 outputs a logic low signal on signal path 136. With a logic low signal on signal path 136, transistor 140 turns off and the source-drain path of transistor 140 is high impedance. Inverters 148 and 152 latch the data signal on data path 146.

With a logic high signal on data path 146 and a logic high signal on ENA signal path 122A, NAND gate 154 outputs a logic low signal on signal path 156. With a logic low signal on signal path 156, transistor 158 turns on and passes the $V_{INT}$ signal from $V_{INT}$ 142 to output signal path 110. With a logic low signal on data path 146, NAND gate 154 outputs a logic high signal on signal path 156. With a logic high signal on signal path 156, transistor 158 turns off and the source-drain path of transistor 158 is high impedance.

With a logic low signal on data path 146 and a logic low signal on ENB signal path 122B, NOR gate 160 outputs a logic high signal on signal path 162. With a logic high signal on signal path 162, transistor 164 turns on and passes the common signal from common 144 to output signal path 110. With a logic high signal on data path 146, NOR gate 160 outputs a logic low signal on signal path 162. With a logic low signal on signal path 162, transistor 164 turns off and the source-drain path of transistor 164 is high impedance.

In operation, the data on data path 120 transitions between logic high and logic low. A logic high signal on data path 120 latches a logic high signal in inverters 148 and 152 if the PA signal on PA signal path 114 is a logic high. A logic low signal on data path 120 latches a logic low signal in inverters 148 and 152 if the PB signal on PB signal path 116 is a logic low. A logic high signal on data path 146 provides a logic high signal on output signal path 110 if the ENA signal on ENA signal path 122A is a logic high. A logic low signal on data path 146 provides a logic low signal on output signal path 110 if the ENB signal on ENB signal path 122B is a logic low.

During a read operation, the ENA signal on ENA signal path 122A is a logic high and the ENB signal on ENB signal path 122B is a logic low to pass data from data path 120 to output signal path 110. By controlling the PA signal on PA signal path 114 and the PB signal on PB signal path 116, the data from memory circuit 102 on data path 120 is output on output signal path 110 and aligned with the clock signal. During a write operation, the ENA signal on ENA signal path 122A is a logic low and the ENB signal on ENB signal path 122B is a logic high to turn off transistors 158 and 164. With transistors 158 and 164 turned off, output signal path 110 is high impedance.

Figure 3:
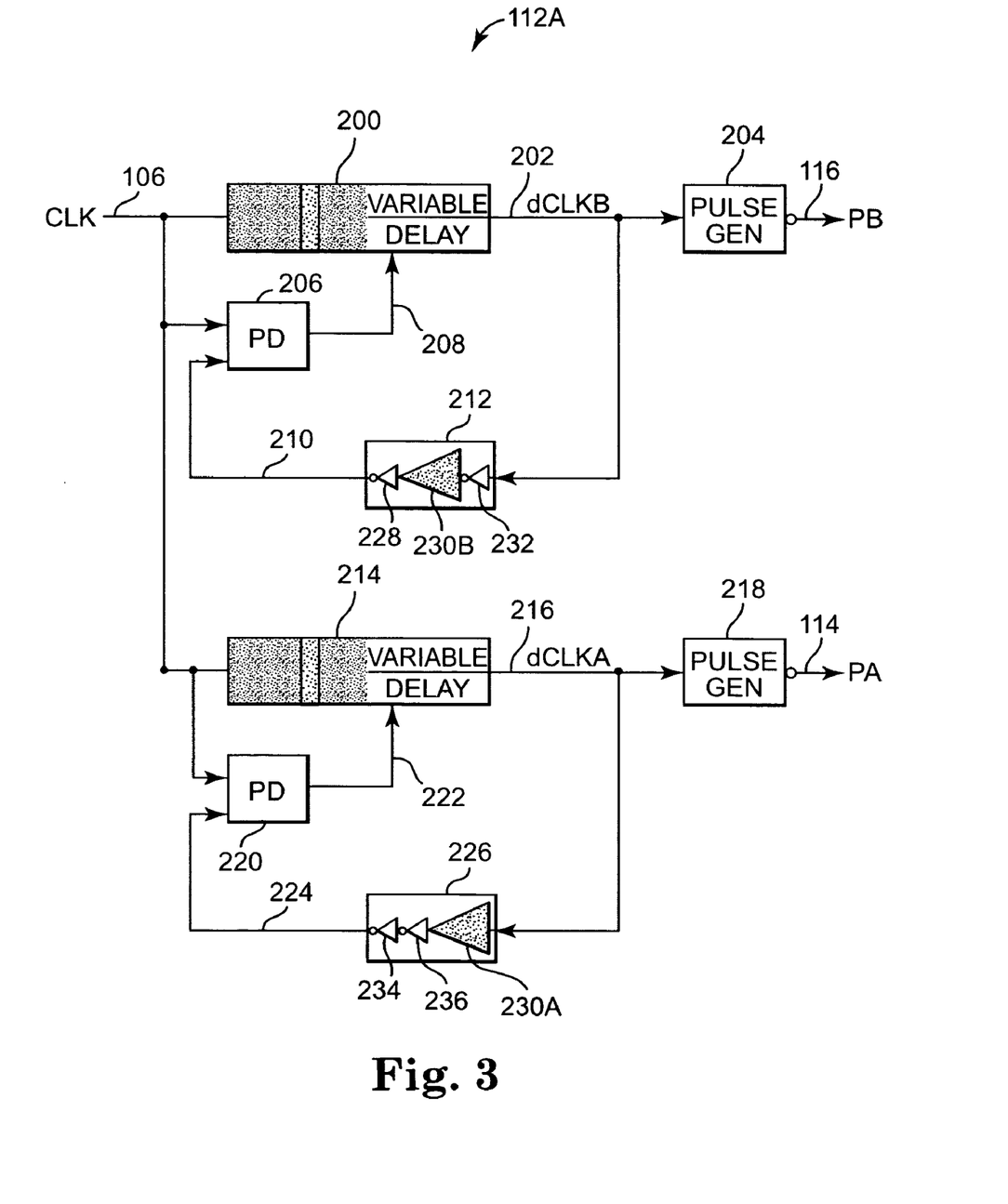
FIG. 3 is a schematic diagram illustrating one embodiment of a delay locked loop (DLL).

FIG. 3 is a schematic diagram illustrating one embodiment 112A of DLL 112. DLL 112A includes variable delays 200 and 214, phase detectors 206 and 220, feedback circuits 212 and 226, and pulse generators 204 and 218. Clock signal path 106 is electrically coupled to the input of variable delay 200, a first input of phase detector 206, the input of variable delay 214, and a first input of phase detector 220. The output of variable delay 200 is electrically coupled to the input of pulse generator 204 and the input of feedback circuit 212 through dCLKB signal path 202. The output of pulse generator 204 provides the PB signal on PB signal path 116. Feedback circuit 212 includes inverter 232, OCD replica circuit 230B, and inverter 228. The output of feedback circuit 212 is electrically coupled to a second input of phase detector 206 through path 210. The output of phase detector 206 is electrically coupled to the control input of variable delay 200 through path 208.

The output of variable delay 214 is electrically coupled to the input of pulse generator 218 and the input of feedback circuit 226 through dCLKA signal path 216. The output of pulse generator 218 provides the PA signal on PA signal path 114. Feedback circuit 226 includes OCD replica 230A and inverters 236 and 234. The output of feedback circuit 226 is electrically coupled to a second input of phase detector 220 through path 224. The output of phase detector 220 is electrically coupled to the control input of variable delay 214 through path 222.

Variable delay circuit 200 delays the clock signal on clock signal path 106 and provides the dCLKB signal on dCLKB signal path 202. The dCLKB signal is input into feedback circuit 212. Feedback circuit 212 inverts the dCLKB signal through inverter 232. OCD replica 230B then mimics the delay of OCD circuit 118 to compensate for the falling edge propagation delay through OCD 118, as described in further detail below with reference to FIG. 4. Inverter 228 inverts the signal again and the signal passes to the input of phase detector 206 through signal path 210. Inverters 228 and 232 are used to compensate for other non OCD related delays in memory circuit 102. Phase detector 206 compares the feedback signal from feedback circuit 212 on signal path 210 to the clock signal and outputs a value to adjust variable delay 200 to reduce the phase difference between the clock signal on clock signal path 106 and the feedback signal on signal path 210 to zero. The dCLKB signal is passed to pulse generator 204, which generates the PB signal on PB signal path 116 by generating a logic low pulse on both the rising and falling edges of the dCLKB signal. The logic low pulses are shorter than one half of the cycle of the clock signal.

Variable delay circuit 214 delays the clock signal on clock signal path 106 and provides the dCLKA signal on dCLKA signal path 216. The dCLKA signal is input into feedback circuit 226. OCD replica 230A mimics the delay of OCD circuit 118 to compensate for the rising edge propagation delay through OCD 118, as described in further detail below with reference to FIG. 4. Feedback circuit 226 then inverts the signal from OCD replica 230A through inverter 236. Inverter 234 inverts the signal again and the signal passes to the input of phase detector 220 through signal path 224. Inverters 236 and 234 are used to compensate for other non OCD related delays in memory circuit 102. Phase detector 220 compares the feedback signal from feedback circuit 226 on signal path 224 to the clock signal and outputs a value to adjust variable delay 214 to reduce the phase difference between the clock signal on clock signal path 106 and the feedback signal on signal path 224 to zero. The dCLKA signal is passed to pulse generator 218, which generates the PA signal on PA signal path 114 by generating a logic high pulse on both the rising and falling edges of the dCLKA signal. The logic high pulses are shorter than one half of the cycle of the clock signal.

The PB signal on PB signal path 116 and the PA signal on PA signal path 114 are passed to OCD 118. During a read operation, in response to the PA signal, logic high data on data path 120 is output on output signal path 110 and aligned with either the rising edge or falling edge of the clock signal. In response to the PB signal, logic low data on data path 120 is output on output signal path 110 and aligned with either the rising edge or falling edge of the clock signal.

Figure 4:
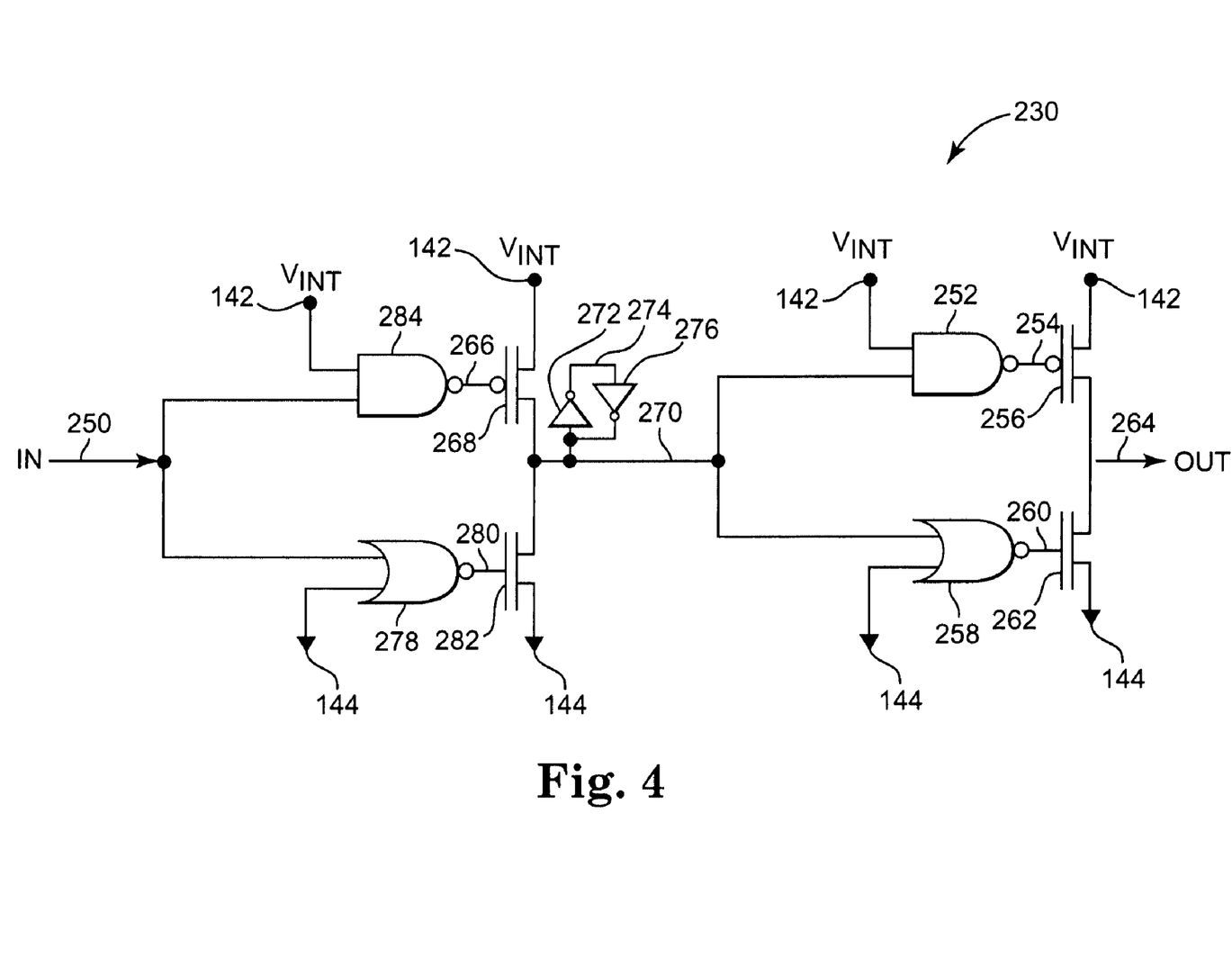
FIG. 4 is a schematic diagram illustrating one embodiment of a portion of a feedback loop for a DLL.

FIG. 4 is a schematic diagram illustrating one embodiment of OCD replica 230. OCD replica 230 is similar to OCD replica 230B of feedback circuit 212 and OCD replica 230A of feedback circuit 226. OCD replica 230 includes NAND gates 284 and 252, NOR gates 278 and 258, PMOSFETs 268 and 256, and NMOSFETs 282 and 262. The input (IN) path 250 of OCD replica 230 is electrically coupled to a first input of NAND gate 284 and a first input of NOR gate 278. $V_{INT}$ 142 is electrically coupled to a second input of NAND gate 284. The output of NAND gate 284 is electrically coupled to the gate of transistor 268 through path 266. One side of the source-drain path of transistor 268 is electrically coupled to $V_{INT}$ 142, and the other side of the source-drain path of transistor 268 is electrically coupled to signal path 270.

Common or ground 144 is electrically coupled to a second input of NOR gate 278. The output of NOR gate 278 is electrically coupled to the gate of transistor 282 through signal path 280. One side of the source-drain path of transistor 282 is electrically coupled to signal path 270, and the other side of the source-drain path of transistor 282 is electrically coupled to common or ground 144. Signal path 270 is electrically coupled to the input of inverter 272 and the output of inverter 276. The output of inverter 272 is electrically coupled to the input of inverter 276 through signal path 274.

Signal path 270 is electrically coupled to a first input of NAND gate 252 and a first input of NOR gate 258. $V_{INT}$ 142 is electrically coupled to a second input of NAND gate 252. The output of NAND gate 254 is electrically coupled to the gate of transistor 256 through signal path 254. One side of the source-drain path of transistor 256 is electrically coupled to $V_{INT}$ 142, and the other side of the source-drain path of transistor 256 is electrically coupled to output (OUT) path 264. Common or ground 144 is electrically coupled to a second input of NOR gate 258. The output of NOR gate 258 is electrically coupled to the gate of transistor 262 through signal path 260. One side of the source-drain path of transistor 262 is electrically coupled to output path 264, and the other side of the source-drain path of transistor 262 is electrically coupled to common or ground 144.

With a logic high signal on input path 250, NAND gate 284 outputs a logic low signal on signal path 266. With a logic low signal on signal path 266, transistor 268 turns on and passes the $V_{INT}$ signal from $V_{INT}$ 142 to signal path 270. With a logic low signal on input path 250, NAND gate 284 outputs a logic high signal on signal path 266. With a logic high signal on signal path 266, transistor 268 turns off and the source-drain path of transistor 268 is high impedance.

With a logic low signal on input path 250, NOR gate 278 outputs a logic high signal on signal path 280. With a logic high signal on signal path 280, transistor 282 turns on and passes the common signal from common 144 to signal path 270. With a logic high signal on input path 250, NOR gate 278 outputs a logic low signal on signal path 280. With a logic low signal on signal path 280, transistor 282 turns off and the source-drain path of transistor 282 is high impedance. Inverters 272 and 276 latch the signal on signal path 270.

With a logic high signal on signal path 270, NAND gate 252 outputs a logic low signal on signal path 254. With a logic low signal on signal path 254, transistor 256 turns on and passes the $V_{INT}$ signal from $V_{INT}$ 142 to output path 264. With a logic low signal on signal path 270, NAND gate 252 outputs a logic high signal on signal path 254. With a logic high signal on signal path 254, transistor 256 turns off and the source-drain path of transistor 256 is high impedance.

With a logic low signal on signal path 270, NOR gate 258 outputs a logic high signal on signal path 260. With a logic high signal on signal path 260, transistor 262 turns on and passes the common signal from common 144 to output path 264. With a logic high signal on signal path 270, NOR gate 258 outputs a logic low signal on signal path 260. With a logic low signal on signal path 260, transistor 262 turns off and the source-drain path of transistor 262 is high impedance.

In operation, a logic high signal on input path 250 provides a logic high signal on output path 264 delayed by the rising edge propagation delay of OCD replica 230. OCD replica 230A delays the dCLKA signal in this manner to provide the feedback signal used to adjust the dCLKA signal to compensate for the rising edge propagation delay of OCD 118. A logic low signal on input path 250 provides a logic low signal on output path 264 delayed by the falling edge propagation delay of OCD replica 230. OCD replica 230B delays an inverted dCLKB signal in this manner to provide the feedback signal used to adjust the dCLKB signal to compensate for the falling edge propagation delay of OCD 118.

Figure 5:
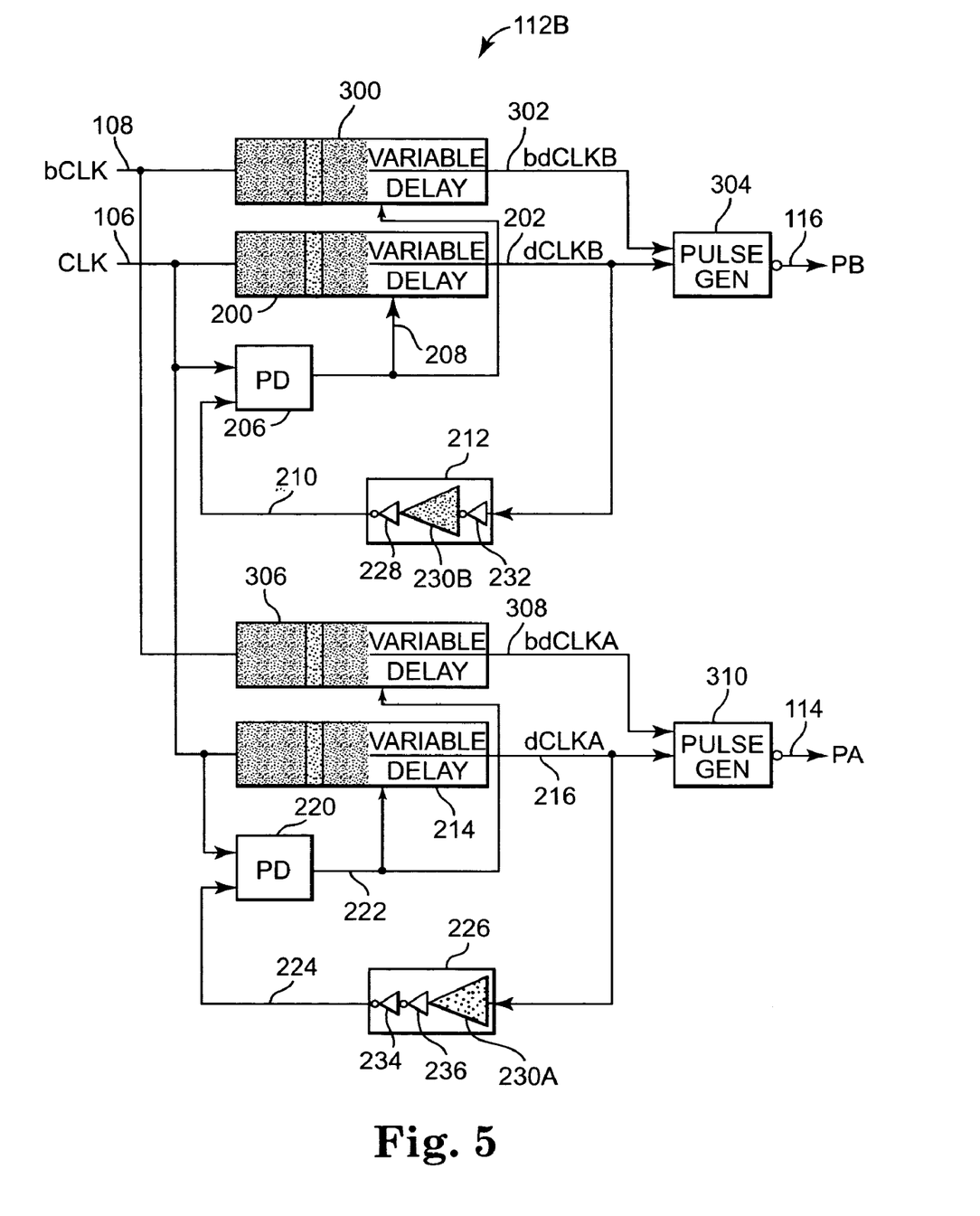
FIG. 5 is a schematic diagram illustrating another embodiment of a DLL.

FIG. 5 is a schematic diagram illustrating another embodiment 112B of DLL 112. In FIG. 3, the falling edge propagation delay and the rising edge propagation delay of the clock signal through variable delay 200 and variable delay 214 were assumed to be equal. If that is not the case, DLL 112B compensates for variations between the rising edge propagation delay and the falling edge propagation delay of the clock signal through variable delay 200 and variable delay 214.

DLL 112B includes similar components to DLL 112A with the exception of additional variable delays 300 and 306 and modified pulse generators 304 and 310. Variable delay 300 is similar to variable delay 200, and variable delay 306 is similar to variable delay 214. The inverted clock (bCLK) signal path 108 is electrically coupled to the input of variable delay 300 and the input of variable delay 306.

The output of variable delay 300 is electrically coupled to a first input of pulse generator 304 through bdCLKB signal path 302. The output of variable delay 200 is electrically coupled to a second input of pulse generator 304 through dCLKB signal path 202. The output of phase detector 206 is electrically coupled to the control input of variable delay 300 through signal path 208.

The output of variable delay 306 is electrically coupled to a first input of pulse generator 310 through bdCLKA signal path 308. The output of variable delay 214 is electrically coupled to a second input of pulse generator 310 through dCLKA signal path 216. The output of phase detector 220 is electrically coupled to the control input of variable delay 306 through signal path 222.

DLL circuit 112B operates similar to DLL circuit 112A, except for the addition of the dbCLKB signal on dbCLKB signal path 302 output from variable delay 300 and the dbCLKA signal on bdCLKA signal path 308 output from variable delay 306. Variable delay 300 delays the inverted clock signal on bCLK signal path 108 and provides the dbCLKB signal on dbCLKB signal path 302. Phase detector 206 also outputs the signal on signal path 208 used to adjust variable delay 200 to the control input of variable delay 300 to adjust variable delay 300. Variable delay 306 delays the inverted clock signal on bCLK signal path 108 and provides the dbCLKA signal on dbCLKA signal path 308. Phase detector 220 also outputs the signal on signal path 222 used to adjust variable delay 214 to the control input of variable delay 306 to adjust variable delay 306.

Pulse generator 304 receives the dbCLKB signal on bdCLKB signal path 302 and the dCLKB signal on dCLKB signal path 202 and provides the PB signal on PB signal path 116. Pulse generator 304 provides a logic low pulse on PB signal path 116 in response to the rising edge of the dCLKB signal and another logic low pulse in response to the rising edge of the bdCLKB signal. The logic low pulses are shorter than one half of the cycle of the clock signal.

Pulse generator 310 receives the dbCLKA signal on bdCLKA signal path 308 and the dCLKA signal on dCLKA signal path 216 and provides the PA signal on PA signal path 114. Pulse generator 310 provides a logic high pulse on PA signal path 114 in response to the rising edge of the dbCLKA signal and another logic high pulse in response to the rising edge of the dCLKA signal. The logic high pulses are shorter than one half of the cycle of the clock signal.

The PB signal on PB signal path 116 compensates for both the falling edge propagation delay of data through OCD 118 and any variations between the rising edge propagation delay and the falling edge propagation delay of the clock signal through variable delay 300 and variable delay 200. The PA signal on PA signal path 114 compensates for both the rising edge propagation delay of data through OCD 118 and any variations between the rising edge propagation delay and the falling edge propagation delay of the clock signal through variable delay 306 and variable delay 214.

The PB signal on PB signal path 116 and the PA signal on PA signal path 114 are passed to OCD 118. During a read operation, in response to the PA signal, logic high data on data path 120 is output on output signal path 110 and aligned with either the rising edge or falling edge of the clock signal. In response to the PB signal, logic low data on data path 120 is output on output signal path 110 and aligned with either the rising edge or falling edge of the clock signal.

Figure 6:
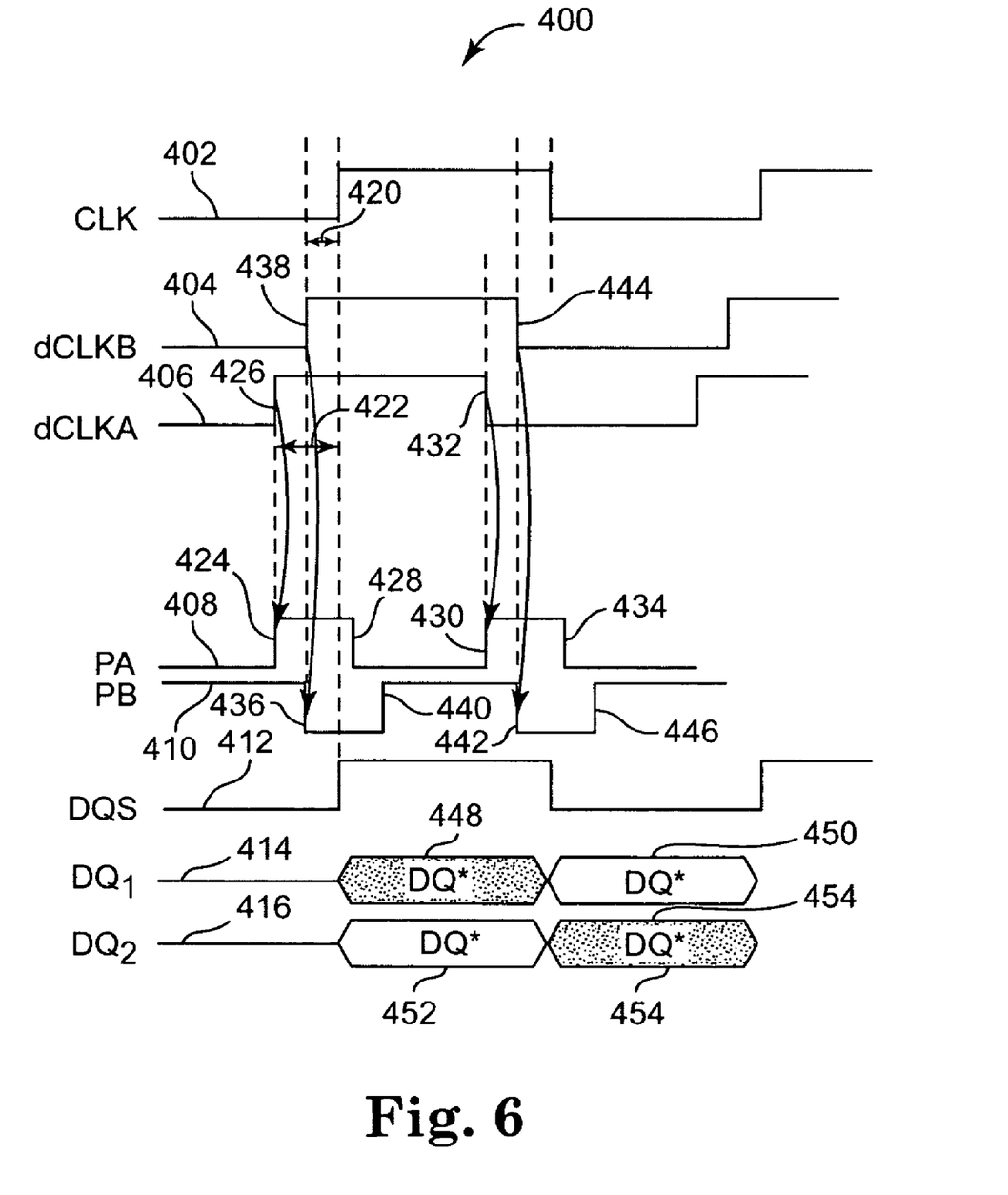
FIG. 6 is a timing diagram illustrating one embodiment of the timing of signals for the memory circuit of FIG. 1.

FIG. 6 is a timing diagram 400 illustrating one embodiment of the timing of signals of system 100 using DLL 112A. Timing diagram 400 includes clock signal 402 on clock signal path 106, dCLKB signal 404 on dCLKB signal path 202, dCLKA signal 406 on dCLKA signal path 216, PA signal 408 on PA signal path 114, PB signal 410 on PB signal path 116, DQS signal 412 on DQS signal path 109, $DQ_1$ signal 414 on output signal path 110 illustrating one embodiment of data, and $DQ_2$ 416 on output signal path 110, illustrating another embodiment of data.

CLK signal 402 is delayed through variable delay 200 to provide dCLKB signal 404 to compensate for the falling edge propagation delay of OCD 118, as indicated at 420. CLK signal 402 is delayed through variable delay 214 to provide dCLKA signal 406 to compensate for the rising edge propagation delay of OCD 118, as indicated at 422. Pulse generator 218 transitions PA signal 408 to a logic high at 424 in response to the rising edge 426 of dCLKA signal 406 and to a logic low at 428. Pulse generator 218 transitions PA signal 408 to a logic high again at 430 in response to the falling edge 432 of dCLKA signal 406 and to a logic low at 434. Pulse generator 204 transitions PB signal 410 to a logic low at 436 in response to the rising edge 438 of dCLKB signal 404 and to a logic high at 440. Pulse generator 204 transitions PB signal 410 to a logic low again at 442 in response to the falling edge 444 of dCLKB signal 404 and to a logic high at 446.

DQS signal 412 is aligned with CLK signal 402. $DQ_1$ signal 414 has a logic high data signal 448 output in response to the rising edge 424 of PA signal 408 and a logic low data signal 450 output in response to falling edge 442 of PB signal 410. $DQ_2$ signal 416 has a logic low data signal 452 output in response to the falling edge 436 of PB signal 410 and a logic high data signal 454 output in response to the rising edge 430 of PA signal 408. Therefore, both logic high data signals and logic low data signals output from OCD 118 are aligned with CLK signal 402.

The present invention provides a circuit having a DLL for correcting for OCD duty distortion. The DLL accounts for both the rising edge propagation delay through the OCD and the falling edge propagation delay through the OCD. Therefore, both logic low data and logic high data output by the OCD is aligned with the rising edge of the clock signal or the falling edge of the clock signal. The data output by the OCD is evenly spaced on the output path to allow the host an equal amount of time to retrieve the data output during the logic high phase of the clock cycle and the logic low phase of the clock cycle.

What is claimed is:

1. A circuit comprising:
    an off chip driver; and
    a delay locked loop configured to receive a clock signal and provide a first signal for compensating for a rising edge propagation delay through the off chip driver and a second signal for compensating for a falling edge propagation delay through the off chip driver,
    wherein the off chip driver is configured to receive the first signal and the second signal and output data aligned with the clock signal,
    wherein the delay locked loop comprises a first variable delay to provide the first signal and a second variable delay to provide the second signal, and
    wherein the delay locked loop comprises a first feedback circuit comprising a first replica of the off chip driver, the first feedback circuit configured to receive the first signal and provide a first feedback signal.

2. The circuit of claim 1, wherein the delay locked loop comprises a second feedback circuit comprising a second replica of the off chip driver, the second feedback circuit configured to receive the second signal and provide a second feedback signal.

3. The circuit of claim 2, wherein the delay locked loop comprises a first phase detector configured to receive the first feedback signal and the clock signal and provide a first control signal for adjusting the first variable delay.

4. The circuit of claim 3, wherein the delay locked loop comprises a second phase detector configured to receive the second feedback signal and the clock signal and provide a second control signal for adjusting the second variable delay.

5. A method of aligning data output from an off chip driver to a clock signal, the method comprising:
    receiving a clock signal and an inverted clock signal;
    delaying the clock signal to provide a first signal compensated for a rising edge propagation delay through the off chip driver;

delaying the inverted clock signal to provide a second signal compensated for a rising edge propagation delay through the off chip driver;

delaying the clock signal to provide a third signal compensated for a filling edge propagation delay through the off chip driver;

delaying the inverted clock signal to provide a fourth signal compensated for a falling edge propagation delay through the off chip driver;

providing a fifth signal comprising a first logic high pulse in response to a rising edge of the first signal and a second logic high pulse in response to a rising edge of the second signal;

providing a sixth signal comprising a first logic low pulse in response to a rising edge of the third signal and a second logic low pulse in response to a rising edge of the fourth signal; and outputting data from the off chip driver in response to the fifth signal and the sixth signal.

6. The method of claim 5, wherein outputting data from the off chip driver comprises outputting logic high data in response to the fifth signal and outputting logic low data in response to the sixth signal.

7. A memory comprising:

a first variable delay configured to delay a clock signal to provide a first signal;

a first feedback circuit configured to delay the first signal by a rising edge propagation delay through a first replica off chip driver to provide a first feedback signal;

a first phase detector configured to compare the first feedback signal to the clock signal and adjust a delay of the first variable delay based on the comparison of the first feedback signal to die clock signal;

a second variable delay configured to delay the clock signal to provide a second signal;

a second feedback circuit configured to delay the second signal by a falling edge propagation delay through a second replica off chip driver to provide a second feedback signal; and a second phase detector configured to compare the second feedback signal to the clock signal and adjust a delay of the second variable delay based on the comparison of the second feedback signal to the clock signal.

8. The memory of claim 7, further comprising:

a first pulse generator configured to provide a third signal comprising a first logic high pulse in response to a rising edge of the first signal and a second logic high pulse in response to a falling edge of the first signal; and a second pulse generator configured to provide a fourth signal comprising a first logic low pulse in response to a rising edge of the second signal and a second logic low pulse in response to a falling edge of the second signal.

9. The memory of claim 8, wherein the off chip driver is configured to output data aligned with the clock signal in response to the third signal and the fourth signal.

10. The memory of claim 9, wherein the off chip driver is configured to output logic high data in response to the third signal and logic low data in response to the fourth signal.

11. The memory of claim 7, further comprising:

a third variable delay configured to delay an inverted clock signal to provide a third signal, the third variable delay adjusted by the first feedback signal; and a fourth variable delay configured to delay the inverted clock signal to provide a fourth signal, the fourth variable delay adjusted by the second feedback signal.

12. The memory of claim 11, further comprising:

a first pulse generator configured to provide a fifth signal comprising a first logic high pulse in response to a rising edge of the first signal and a second logic high pulse in response to a rising edge of the third signal; and a second pulse generator configured to provide a sixth signal comprising a first logic low pulse in response to a rising edge of the second signal and a second logic low pulse in response to a rising edge of the fourth signal.

13. The memory of claim 12, wherein the off chip driver is configured to output data aligned with the clock signal in response to the fifth signal and the sixth signal.

14. The memory of claim 13, wherein the off chip driver is configured to output logic high data in response to the fifth signal and logic low data in response to the sixth signal.

15. A method for aligning data output from an off chip driver to a clock signal, the method comprising:

receiving a clock signal;

generating a first signal from the clock signal to compensate for a rising edge propagation delay through an off chip driver;

generating a second signal from the clock signal to compensate for a falling edge propagation delay through the off chip driver; and providing the first signal and the second signal to the off chip driver to output data from the off chip driver aligned to the clock signal;

wherein generating the first signal comprises delaying the clock signal through a first variable delay, and wherein generating the second signal comprises delaying the clock signal through a second variable delay; and wherein delaying the clock signal through the first variable delay comprises delaying the clock signal through the first variable delay based on a first feedback signal, the first feedback signal comprising delaying the first signal through a first replica off chip driver, and wherein delaying the clock signal through the second variable delay comprises delaying the clock signal through the second variable delay based on a second feedback signal, the second feedback signal comprising delaying the second signal through a second replica off chip driver.

16. The method of claim 15, wherein the first signal outputs logic high data from the off chip driver and the second signal outputs logic low data from the off chip driver.

17. The method of claim 15, wherein delaying the clock signal through the first variable delay comprises delaying the clock signal through the first variable delay based on a comparison of the clock signal to the first feedback signal, and wherein delaying the clock signal through the second variable delay comprises delaying the clock signal through the second variable delay based on a comparison of the clock signal to the second feedback signal.

* * * * *